(12) United States Patent
Won

(10) Patent No.: US 12,108,673 B2
(45) Date of Patent: Oct. 1, 2024

(54) THERMOELECTRIC MODULE

(71) Applicant: LG INNOTEK CO., LTD., Seoul (KR)

(72) Inventor: Boone Won, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 64 days.

(21) Appl. No.: 17/791,150

(22) PCT Filed: Dec. 21, 2020

(86) PCT No.: PCT/KR2020/018792
§ 371 (c)(1),
(2) Date: Jul. 6, 2022

(87) PCT Pub. No.: WO2021/141284
PCT Pub. Date: Jul. 15, 2021

(65) Prior Publication Data
US 2023/0027983 A1    Jan. 26, 2023

(30) Foreign Application Priority Data

Jan. 7, 2020   (KR) .................. 10-2020-0002123

(51) Int. Cl.
| | |
|---|---|
| *H10N 10/13* | (2023.01) |
| *H10N 10/17* | (2023.01) |
| *H10N 10/81* | (2023.01) |
| *H10N 30/02* | (2023.01) |
| *H10N 30/88* | (2023.01) |

(52) U.S. Cl.
CPC ............. *H10N 10/13* (2023.02); *H10N 10/17* (2023.02); *H10N 10/81* (2023.02); *H10N 30/02* (2023.02); *H10N 30/88* (2023.02)

(58) Field of Classification Search
CPC ........ H10N 10/13; H10N 10/17; H10N 10/80; H10N 10/81; H10N 30/02; H10N 30/88
See application file for complete search history.

(56) References Cited

U.S. PATENT DOCUMENTS

| | | | |
|---|---|---|---|
| 2006/0021744 A1* | 2/2006 | Vogel | F28F 3/12 165/170 |
| 2008/0184710 A1* | 8/2008 | DeVilbiss | F25B 21/02 62/3.2 |
| 2014/0054762 A1* | 2/2014 | Nagaune | H01L 23/473 257/714 |
| 2020/0119248 A1* | 4/2020 | Lee | H10N 10/82 |
| 2021/0216121 A1* | 7/2021 | Weldon | H05K 7/20272 |

FOREIGN PATENT DOCUMENTS

| | | |
|---|---|---|
| JP | 2008-21931 A | 1/2008 |
| JP | 2013-239477 A | 11/2013 |
| KR | 10-2012-0079277 A | 7/2012 |
| KR | 10-2013-0013195 A | 2/2013 |
| KR | 10-2019-0038101 A | 4/2019 |

* cited by examiner

*Primary Examiner* — Michael Y Sun
(74) *Attorney, Agent, or Firm* — Birch, Stewart, Kolasch & Birch, LLP

(57) ABSTRACT

A thermoelectric module according to one embodiment of the present invention comprises: a heat exchange unit; and a thermoelectric element disposed on the heat exchange unit, wherein the heat exchange unit includes a case for accommodating a material for heat exchange and a cover covering the case, the thermoelectric element is disposed on the cover, and the thermal conductivity of the cover is higher than the thermal conductivity of the case.

20 Claims, 10 Drawing Sheets

[FIG. 1]
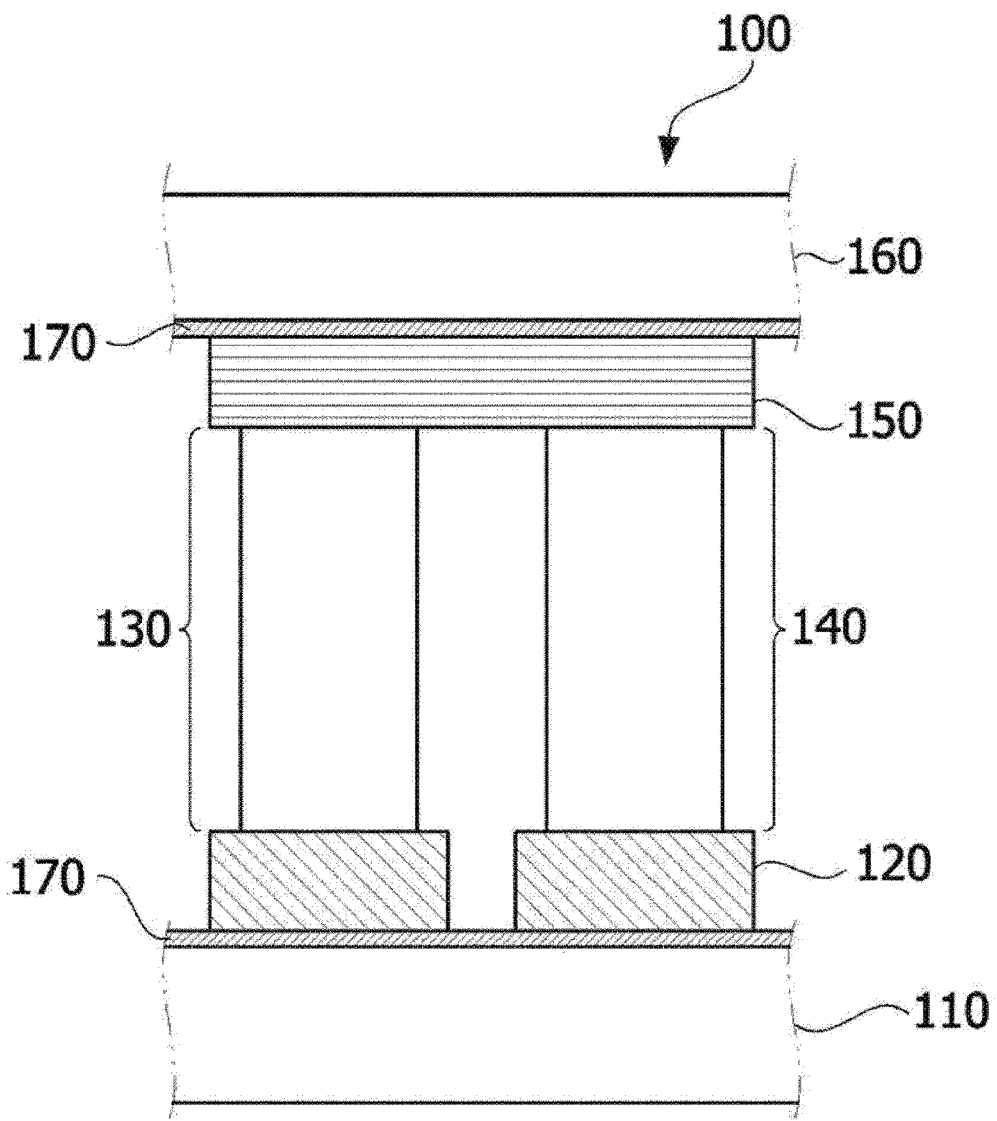

[FIG. 2]
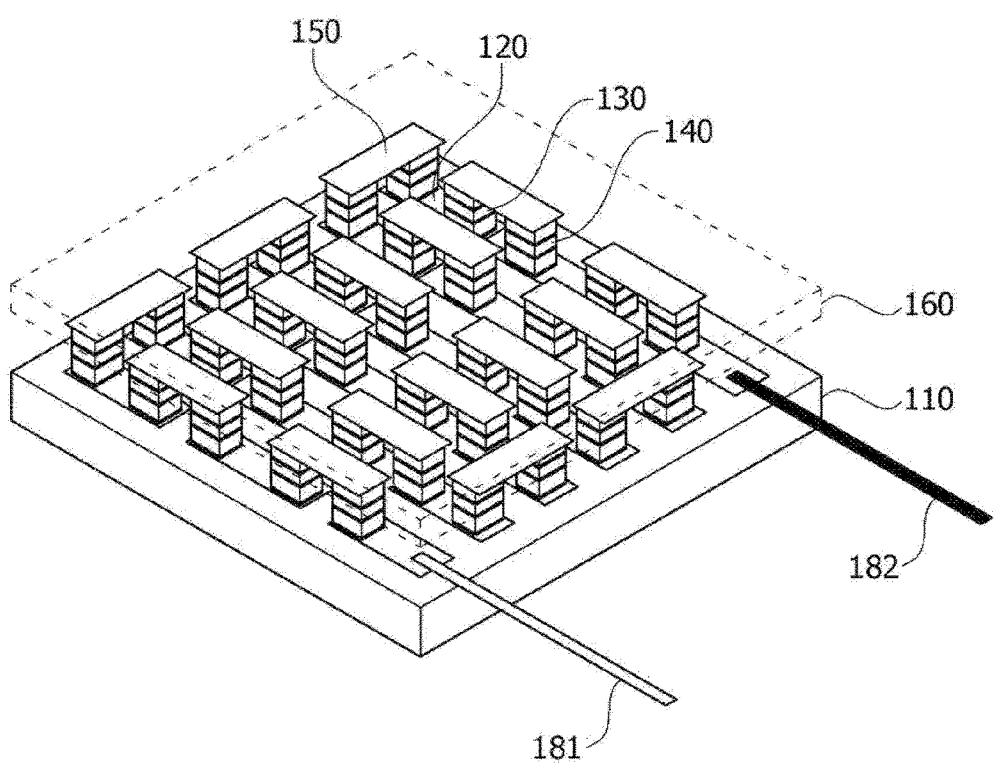

[FIG. 3]
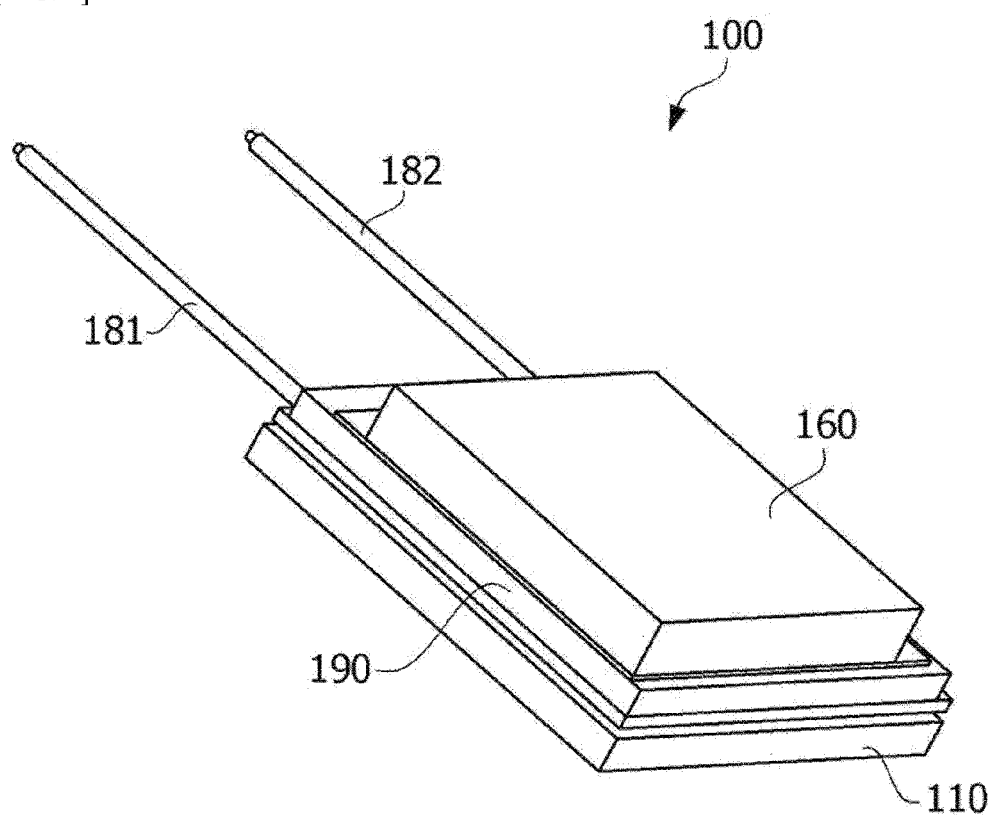

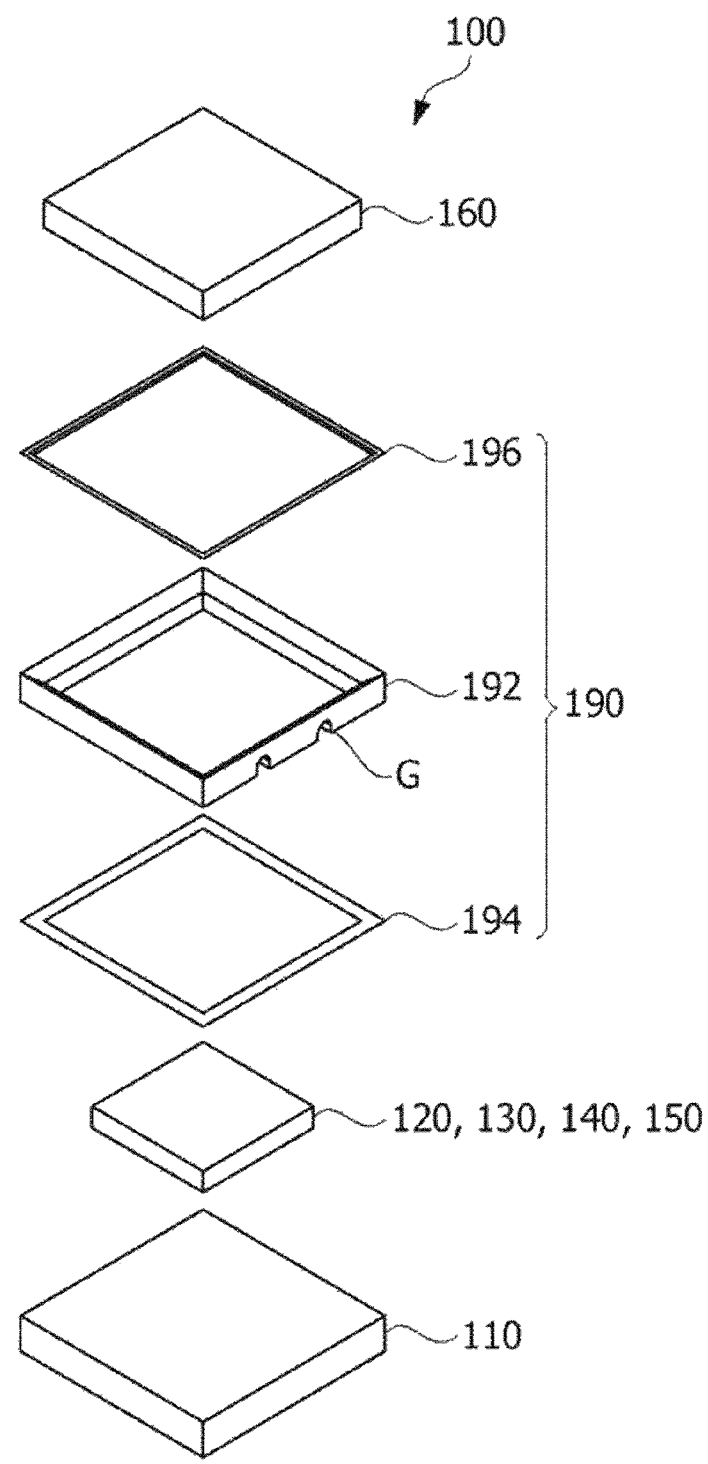
[FIG. 4]

[FIG. 5]
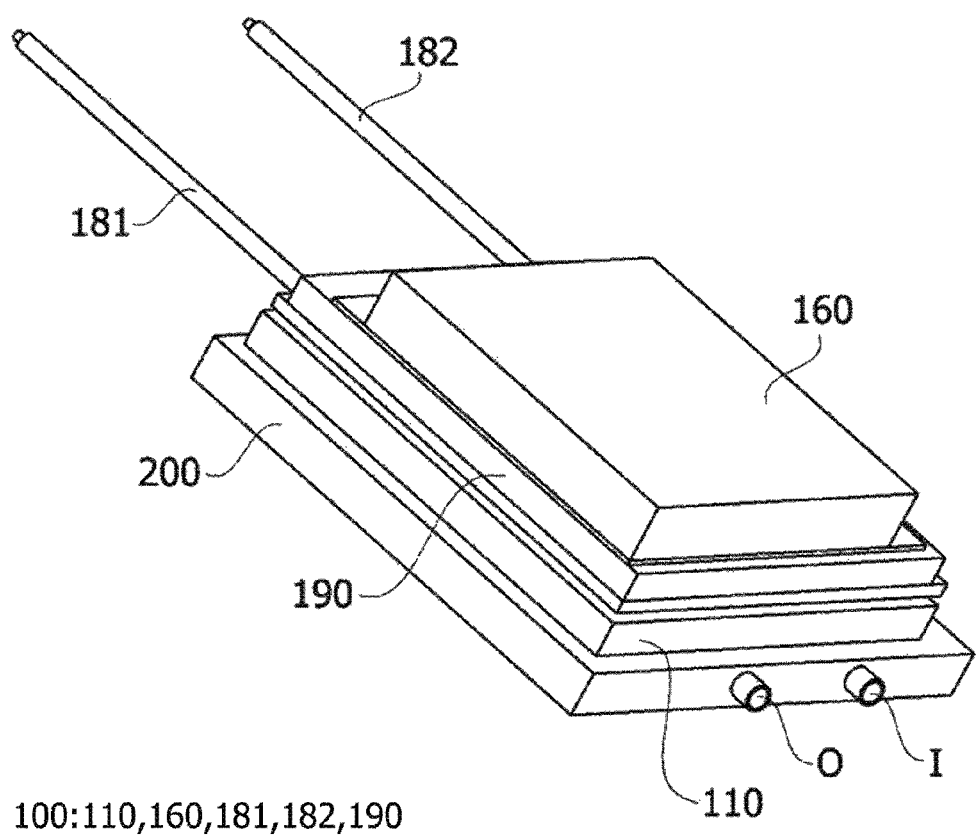
100:110,160,181,182,190

[FIG. 6]
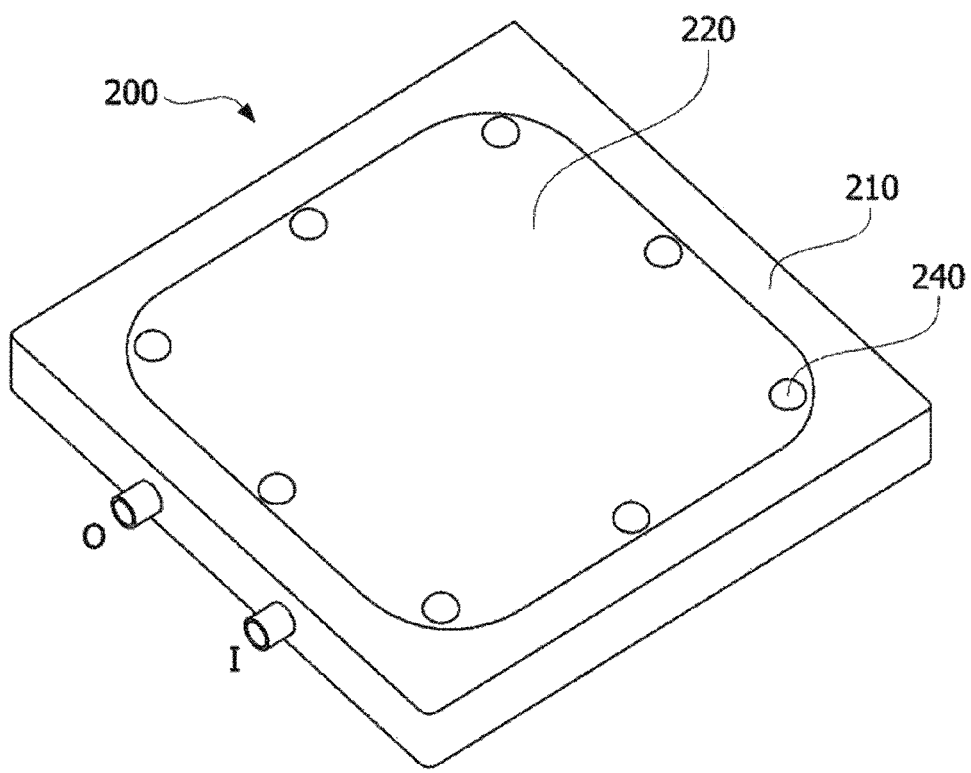

[FIG. 7]
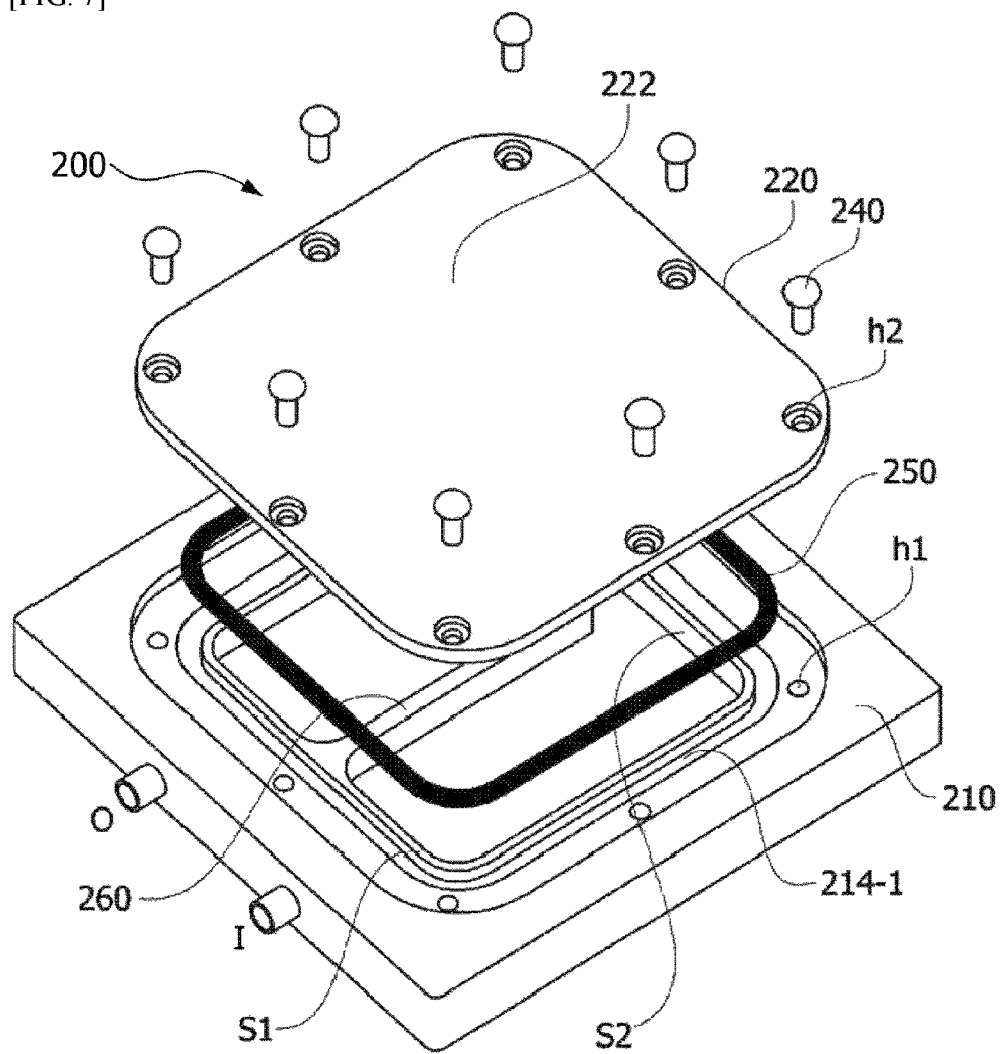

[FIG. 8]
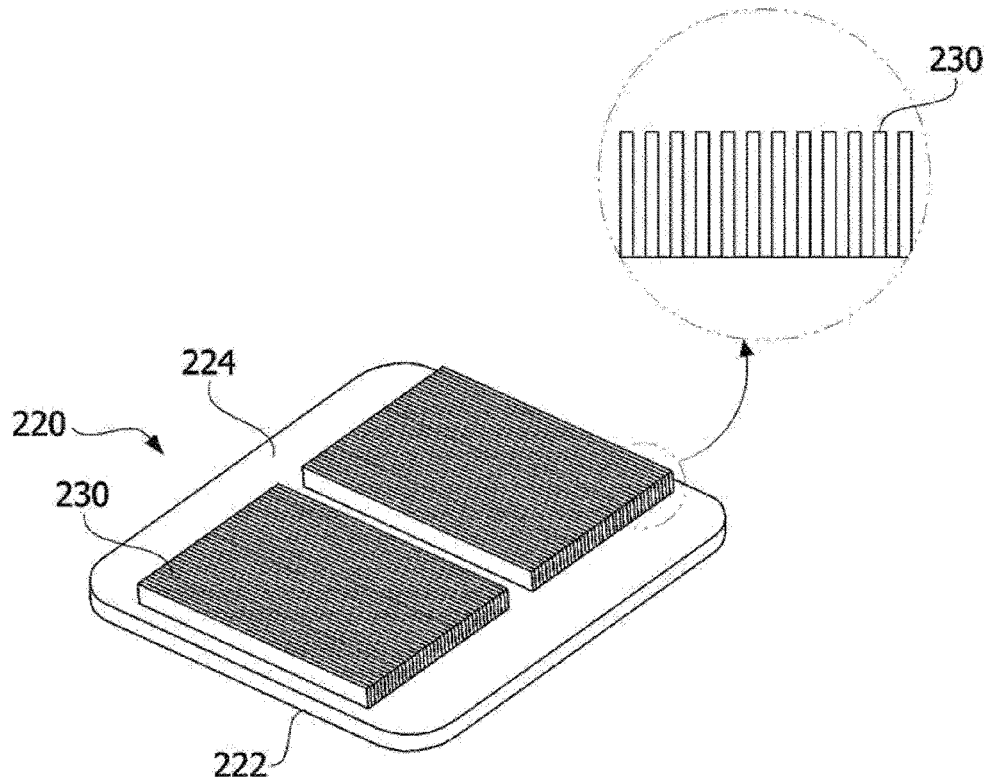
[FIG. 9]
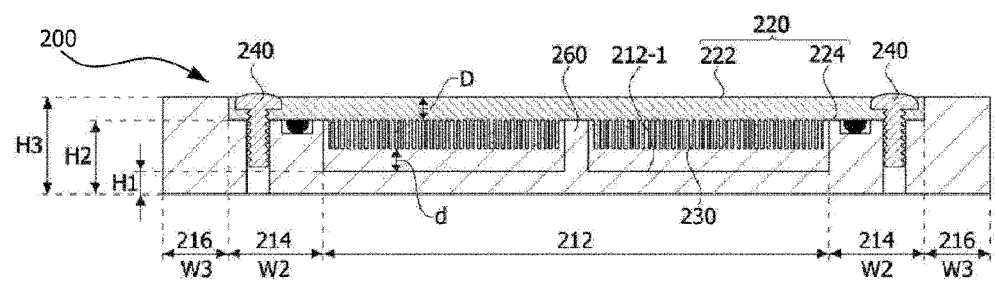

[FIG. 10]
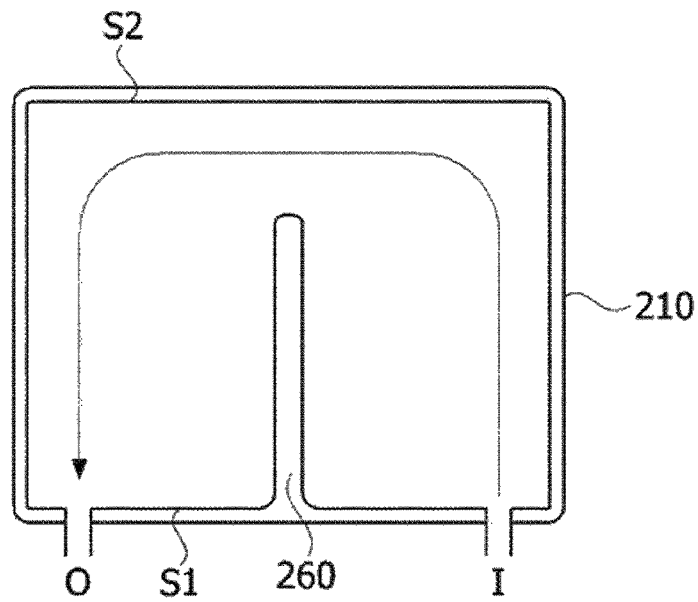
(a)
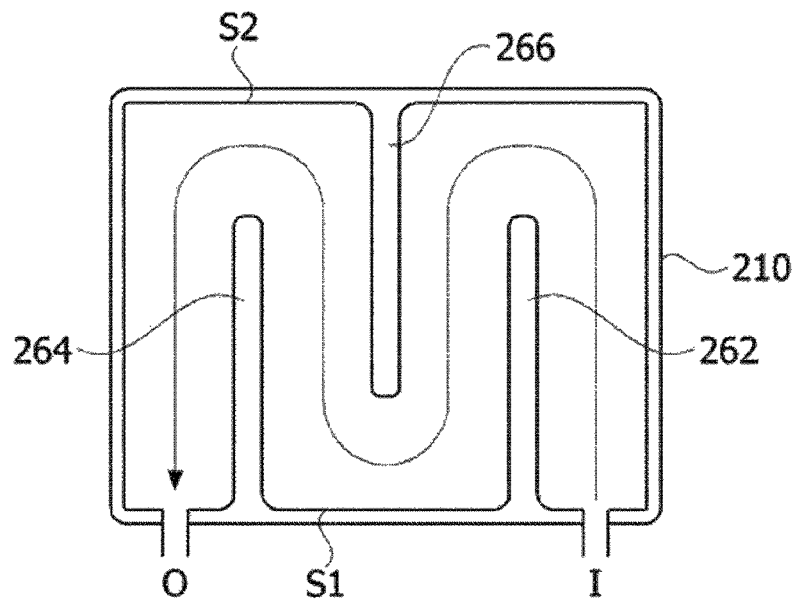
(b)

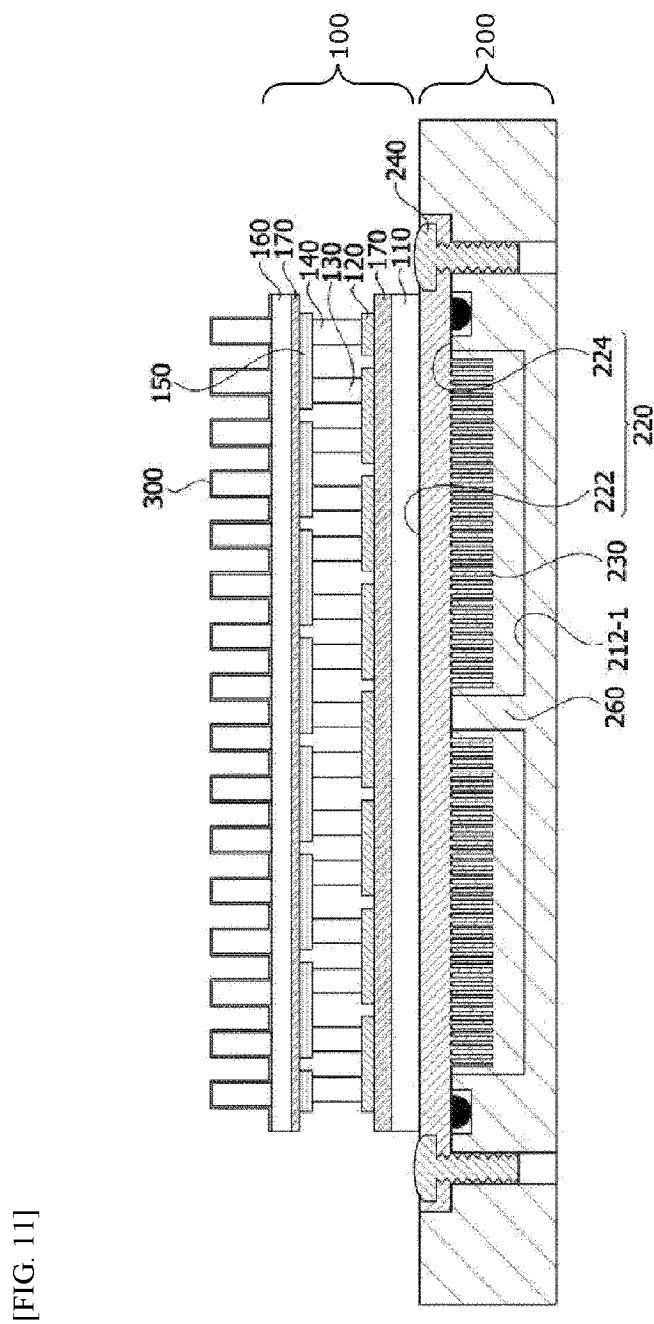
[FIG. 11]

THERMOELECTRIC MODULE

CROSS REFERENCE TO RELATED APPLICATIONS

This application is the National Phase of PCT/KR2020/018792 filed on Dec. 21, 2020, which claims priority under 35 U.S.C. § 119(a) to Patent Application No. 10-2020-0002123 filed in the Republic of Korea on Jan. 7, 2020, all of which are hereby expressly incorporated by reference into the present application.

TECHNICAL FIELD

The present invention relates to a thermoelectric module, and more specifically, to a structure of a heat exchange unit included in a thermoelectric module.

BACKGROUND ART

A thermoelectric effect is a direct energy conversion phenomenon between heat and electricity that occurs due to movement of electrons and holes in a material.

A thermoelectric device is generally referred to as a device using a thermoelectric effect and has a structure in which P-type thermoelectric materials and N-type thermoelectric materials are disposed between and bonded to metal electrodes to form PN junction pairs.

Thermoelectric devices may be divided into devices using a change in electrical resistance depending on a change in temperature, devices using the Seebeck effect in which an electromotive force is generated due to a difference in temperature, devices using the Peltier effect in which heat absorption or heating occurs due to a current, and the like. Thermoelectric devices have been variously applied to home appliances, electronic components, communication components, and the like. As an example, thermoelectric devices may be applied to cooling apparatuses, heating apparatuses, power generation apparatuses, and the like. Therefore, the demand for the thermoelectric performance of thermoelectric device is gradually increasing.

A thermoelectric device includes substrates, electrodes, and thermoelectric legs, the plurality of thermoelectric legs are disposed between an upper substrate and a lower substrate in an array form, a plurality of upper electrodes are disposed between the plurality of thermoelectric legs and the upper substrate, and a plurality of lower electrodes are disposed between the plurality of thermoelectric legs and the lower substrate. In this case, one of the upper substrate and the lower substrate may serve as a low-temperature part, and remaining one may serve as a high-temperature part.

Meanwhile, when the thermoelectric devices are applied to cooling apparatuses, heating apparatuses, power generation apparatuses, and the like, a heat exchange unit may be disposed on one surface of the thermoelectric device, and the thermoelectric performance of the thermoelectric device may vary depending on heat exchange efficiency between the thermoelectric device and the heat exchange unit.

DISCLOSURE

Technical Problem

The present invention is directed to providing a thermoelectric module with improved heat exchange efficiency.

Technical Solution

One aspect of the present invention provides a thermoelectric module including a heat exchange unit and a thermoelectric device disposed on the heat exchange unit, wherein the heat exchange unit includes a case for accommodating a heat exchange material and a cover for covering the case, the thermoelectric device is disposed on the cover, and a thermal conductivity of the cover is higher than a thermal conductivity of the case.

The cover may include a first surface which is disposed toward an outside of the case and on which the thermoelectric device is disposed and a second surface disposed toward an inside of the case, wherein a plurality of heat radiation fins may be formed on the second surface.

The case may include a first region in which the plurality of heat radiation fins are accommodated and a second region which surrounds the first region and includes a coupling member for coupling the case to the cover.

The coupling member may be a plurality of holes, and the case and the cover may be coupled by a plurality of coupling members in the second region.

The case and the cover may be water-tightly coupled in the second region.

The coupling member may be a groove having a ring shape, and an O-ring may be disposed in the groove.

The case may further include a third region which surrounds the second region and of which a height is greater than a height of the second region.

A bottom surface of the first region and the plurality of heat radiation fins may be spaced a predetermined distance from each other.

At least one guide protruding from a bottom surface may be disposed in the first region, and one end of the guide may be spaced apart from a wall surface of the case.

A fluid inlet and a fluid outlet may be formed in the case.

A temperature of a fluid introduced through the fluid inlet may be higher than a temperature of the fluid discharged through the fluid outlet.

A temperature of a fluid introduced through the fluid inlet may be lower than a temperature of the fluid discharged through the fluid outlet.

The cover may include a metal, and the case may include an insulation material.

Advantageous Effects

According to embodiments of the present invention, a thermoelectric device with improved heat exchange efficiency between a heat exchange unit and the thermoelectric device can be obtained. In addition, according to the embodiment of the present invention, a heat loss of the heat exchange unit can be prevented even without a separate thermal insulation material, and thus, a manufacturing cost can be reduced, a manufacturing process can be simplified, and an area occupied by a thermoelectric module can be reduced.

DESCRIPTION OF DRAWINGS

FIG. 1 is a cross-sectional view illustrating a thermoelectric device.

FIG. 2 is a perspective view illustrating the thermoelectric device.

FIG. 3 is a perspective view illustrating the thermoelectric device including a sealing member.

FIG. 4 is an exploded perspective view illustrating the thermoelectric device including the sealing member.

FIG. 5 is a perspective view illustrating a thermoelectric module according to one embodiment of the present invention.

FIG. 6 is a perspective view illustrating a heat exchange unit included in the thermoelectric module according to one embodiment of the present invention.

FIG. 7 is an exploded perspective view illustrating the heat exchange unit included in the thermoelectric module according to one embodiment of the present invention.

FIG. 8 is a perspective view illustrating a cover included in the heat exchange unit of FIG. 7.

FIG. 9 is a cross-sectional view illustrating the heat exchange unit included in the thermoelectric module according to one embodiment of the present invention.

FIG. 10 is a set of views illustrating a guide disposed in a case of the heat exchange unit according to an embodiment of the present invention.

FIG. 11 is a cross-sectional view illustrating the thermoelectric module according to one embodiment of the present invention.

MODES OF THE INVENTION

Hereinafter, exemplary embodiments of the present invention will be described in detail with reference to the accompanying drawings.

However, the technical spirit of the present invention is not limited to some embodiments which will be described and may be realized using various other embodiments, and at least one component of the embodiments may be selectively coupled, substituted, and used within the range of the technical spirit of the present invention.

In addition, unless clearly and specifically defined otherwise by context, all terms (including technical and scientific terms) used herein can be interpreted as having meanings customarily understood by those skilled in the art, and meanings of generally used terms, such as those defined in commonly used dictionaries, will be interpreted by considering contextual meanings of the related technology.

In addition, the terms used in the embodiments of the present invention are considered in a descriptive sense and not for limiting the present invention.

In the present specification, unless specifically indicated otherwise by the context, singular forms may include the plural forms thereof, and in a case in which "at least one (or one or more) among A, B, and C" is described, this may include at least one combination among all possible combinations of A, B, and C.

In addition, in descriptions of components of the present invention, terms such as "first," "second," "A," "B," "(a)," and "(b)" can be used.

The terms are only to distinguish one element from another element, and an essence, order, and the like of the element are not limited by the terms.

In addition, when an element is referred to as being "connected" or "coupled" to another element, such a description may include not only a case in which the element is directly connected or coupled to another element but also a case in which the element is connected or coupled to another element with still another element disposed therebetween.

In addition, in a case in which any one element is described as being formed or disposed "on" or "under" another element, such a description includes not only a case in which the two elements are formed or disposed in direct contact with each other but also a case in which one or more other elements are formed or disposed between the two elements. In addition, when one element is described as being disposed "on or under" another element, such a description may include a case in which the one element is disposed at an upper side or lower side with respect to another element.

FIG. 1 is a cross-sectional view illustrating a thermoelectric device, and FIG. 2 is a perspective view illustrating the thermoelectric device. FIG. 3 is a perspective view illustrating the thermoelectric device including a sealing member, and FIG. 4 is an exploded perspective view illustrating the thermoelectric device including the sealing member.

Referring to FIGS. 1 and 2, a thermoelectric device 100 includes a lower substrate 110, lower electrodes 120, P-type thermoelectric legs 130, N-type thermoelectric legs 140, upper electrodes 150, and an upper substrate 160.

The lower electrodes 120 are disposed between the lower substrate 110 and lower surfaces of the P-type thermoelectric legs 130 and the N-type thermoelectric legs 140, and the upper electrodes 150 are disposed between the upper substrate 160 and upper surfaces of the P-type thermoelectric legs 130 and the N-type thermoelectric legs 140. Accordingly, the plurality of P-type thermoelectric legs 130 and the plurality of N-type thermoelectric legs 140 are electrically connected through the lower electrodes 120 and the upper electrodes 150. A pair of the P-type thermoelectric leg 130 and the N-type thermoelectric leg 140 that are disposed between the lower electrodes 120 and the upper electrode 150 and electrically connected to each other may form a unit cell.

As an example, when a voltage is applied to the lower electrodes 120 and the upper electrodes 150 through lead wires 181 and 182, due to the Peltier effect, the substrate through which a current flows from the P-type thermoelectric leg 130 to the N-type thermoelectric leg 140 may absorb heat to serve as a cooling portion, and the substrate through which a current flows from the N-type thermoelectric leg 140 to the P-type thermoelectric leg 130 may be heated to serve as a heating portion. Alternatively, when different temperatures are applied to the lower electrode 120 and the upper electrode 150, due to the Seebeck effect, electric charges may move through the P-type thermoelectric leg 130 and the N-type thermoelectric leg 140 so that electricity may also be generated.

In this case, each of the P-type thermoelectric leg 130 and the N-type thermoelectric leg 140 may be a bismuth-telluride (Bi—Te)-based thermoelectric leg mainly including Bi and Te. The P-type thermoelectric leg 130 may be a Bi—Te-based thermoelectric leg including at least one among antimony (Sb), nickel (Ni), aluminum (Al), copper (Cu), silver (Ag), lead (Pb), boron (B), gallium (Ga), Te, Bi, and indium (In). As an example, the P-type thermoelectric leg 130 may include Bi—Sb—Te at 99 to 99.999 wt % as a main material and at least one material at 0.001 to 1 wt % based on a total weight of 100 wt % among Ni, Al, Cu, Ag, Pb, B, Ga, and In. The N-type thermoelectric leg 140 may be the Bi—Te-based thermoelectric leg including at least one among Se, Ni, Al, Cu, Ag, Pb, B, Ga, Te, Bi, and In. As an example, the N-type thermoelectric leg 140 may include Bi—Se—Te at 99 to 99.999 wt % as a main material and at least one material at 0.001 to 1 wt % based on a total weight of 100 wt % among Ni, Al, Cu, Ag, Pb, B, Ga, and In. Accordingly, in the present specification, the thermoelectric leg may also be referred to as a semiconductor structure, a semiconductor element, a semiconductor material layer, a conductive semiconductor structure, a thermoelectric structure, a thermoelectric material layer, or the like.

Each of the P-type thermoelectric leg 130 and the N-type thermoelectric leg 140 may be formed in a bulk type or stack type. Generally, the bulk type P-type thermoelectric leg 130 or the bulk type N-type thermoelectric leg 140 may be formed through a process in which a thermoelectric material is heat-treated to manufacture an ingot, the ingot is ground and strained to obtain a powder for a thermoelectric leg, the powder is sintered, and the sintered powder is cut. In this case, each of the P-type thermoelectric leg 130 and the N-type thermoelectric leg 140 may be a polycrystalline thermoelectric leg. When the powder for the thermoelectric leg is sintered in order to manufacture the polycrystalline thermoelectric leg, the powder may be compressed at 100 MPa to 200 MPa. As an example, when the P-type thermoelectric leg 130 is sintered, the powder for the thermoelectric leg may be sintered at 100 to 150 MPa, preferably at 110 to 140 MPa, and more preferably at 120 to 130 MPa. In addition, when the N-type thermoelectric leg 130 is sintered, the powder for the thermoelectric leg may be sintered at 150 to 200 MPa, preferably at 160 to 195 MPa, and more preferably at 170 to 190 MPa. As described above, when each of the P-type thermoelectric leg 130 and the N-type thermoelectric leg 140 is the polycrystalline thermoelectric leg, strength of the P-type thermoelectric leg 130 and the N-type thermoelectric leg 140 may increase. The stack type P-type thermoelectric leg 130 or the stack type N-type thermoelectric leg 140 may be formed in a process in which a paste containing a thermoelectric material is applied on base members each having a sheet shape to form unit members, and the unit members are stacked and cut.

In this case, pairs of the P-type thermoelectric legs 130 and the N-type thermoelectric legs 140 may have the same shape and volume or may have different shapes and volumes. As an example, since electrical conduction properties of the P-type thermoelectric leg 130 and the N-type thermoelectric leg 140 are different, a height or cross-sectional area of the N-type thermoelectric leg 140 may be different from that of the P-type thermoelectric leg 130.

In this case, the P-type thermoelectric leg 130 or N-type thermoelectric leg 140 may have a cylindrical shape, a polygonal column shape, an elliptical column shape, or the like.

Alternatively, the P-type thermoelectric leg 130 or the N-type thermoelectric leg 140 may also have a stack type structure. As an example, the P-type thermoelectric leg or the N-type thermoelectric leg may be formed using a method in which a plurality of structures in which a semiconductor material is applied on base members each having a sheet shape are stacked and cut. Accordingly, material loss can be prevented, and electrical conductivity can be improved. The structures may further include conductive layers having open patterns, and thus, an adhesive force between the structures can increase, heat conductivity can decrease, and electrical conductivity can increase.

Alternatively, the P-type thermoelectric leg 130 or the N-type thermoelectric leg 140 may have different cross-sectional areas formed in one thermoelectric leg. As an example, in one thermoelectric leg, cross-sectional areas of both end portions disposed toward the electrodes are greater than a cross-sectional area between both end portions. Accordingly, since a difference between temperatures of both end portions may be large, thermoelectric efficiency can be improved.

The performance of a thermoelectric device according to one embodiment of the present invention may be expressed as a thermoelectric performance figure of merit (ZT). The thermoelectric performance figure of merit (ZT) may be expressed by Equation 1.

$$ZT = \alpha^2 \cdot \sigma \cdot T/k \quad \text{[Equation 1]}$$

Here, α denotes the Seebeck coefficient [V/K], σ denotes electrical conductivity [S/m], and $\alpha^2 \cdot \sigma$ denotes a power factor [W/mK$^2$]. In addition, T denotes temperature, and k denotes thermal conductivity [W/mK]. k may be expressed as a·cp·p, wherein α denotes thermal diffusivity [cm$^2$/S], cp denotes specific heat [J/gK], and p denotes density [g/cm$^3$].

In order to obtain the thermoelectric performance figure of merit (ZT) of a thermoelectric device, a Z value (V/K) is measured using a Z meter, and thus the thermoelectric performance figure of merit (ZT) may be calculated using the measured Z value.

In this case, each of the lower electrodes 120 disposed between the lower substrate 110 and the P-type thermoelectric legs 130 and N-type thermoelectric legs 140 and the upper electrodes 150 disposed between the upper substrate 160 and the P-type thermoelectric legs 130 and N-type thermoelectric legs 140 may include at least one among Cu, Ag, Al, and Ni and may have a thickness of 0.01 mm to 0.3 mm. When the thickness of the lower electrode 120 or the upper electrode 150 is less than 0.01 mm, an electrode function is degraded, and thus the electrical conductivity performance may be lowered, and when the thickness thereof is greater than 0.3 mm, resistance increases, and thus conduction efficiency can be lowered.

In addition, the lower substrate 110 and the upper substrate 160, which are opposite to each other, may be metal substrates, and a thickness of each of the lower substrate 110 and the upper substrate 160 may be in the range of 0.1 mm to 1.5 mm. When the thickness of the metal substrate is less than 0.1 mm or greater than 1.5 mm, since a heat radiation property or heat conductivity may become excessively high, reliability of the thermoelectric device may be degraded. In addition, when the lower substrate 110 and the upper substrate 160 are the metal substrates, insulating layers 170 may be further formed between the lower substrate 110 and the lower electrodes 120 and between the upper substrate 160 and the upper electrodes 150. The insulating layer 170 may include a material having a heat conductivity of 1 to 20 W/K.

In this case, sizes of the lower substrate 110 and the upper substrate 160 may also be different. As an example, a volume, thickness, or area of one of the lower substrate 110 and the upper substrate 160 may be greater than that of the other. Accordingly, the heat absorption or radiation performance of the thermoelectric device can be improved. Preferably, at least any one of the volume, the thickness, and the area of the lower substrate 110 may be greater than a corresponding one of the upper substrate 160. In this case, when the lower substrate 110 is disposed in a high-temperature region for the Seebeck effect, at least any one of the volume, the thickness, and the area of the lower substrate 110 may be greater than a corresponding one of the upper substrate 160 when compared to a case in which the lower substrate 110 is applied to a heating region for the Peltier effect or a case in which the sealing member is disposed on the lower substrate 110 in order to protect a thermoelectric module, which will be described below, from an external environment. In this case, the area of the lower substrate 110 may be 1.2 to 5 times the area of the upper substrate 160. When the area of the lower substrate 110 is less than 1.2 times the area of the upper substrate 160, an effect of improvement of heat transfer efficiency is not high, and when the area of the lower substrate 110 is greater than 5 times the area of the upper substrate 160, the heat transfer efficiency is reduced remarkably, and it may be difficult to maintain a basic shape of the thermoelectric module.

In addition, a heat radiation pattern, for example, an uneven pattern, may be formed on a surface of at least one of the lower substrate 110 and the upper substrate 160. Accordingly, the heat radiation performance of the thermoelectric device can be improved. When the uneven pattern is formed on a surface in contact with the P-type thermoelectric leg 130 or the N-type thermoelectric leg 140, a bonding property between the thermoelectric leg and the substrate can be improved. The thermoelectric device 100 includes the lower substrate 110, the lower electrodes 120, the P-type thermoelectric legs 130, the N-type thermoelectric legs 140, the upper electrodes 150, and the upper substrate 160.

As illustrated in FIGS. 3 and 4, a sealing member 190 may be further disposed between the lower substrate 110 and the upper substrate 160. The sealing member may be disposed on side surfaces of the lower electrodes 120, the P-type thermoelectric legs 130, the N-type thermoelectric legs 140, and the upper electrodes 150 between the lower substrate 110 and the upper substrate 160. Accordingly, the lower electrodes 120, the P-type thermoelectric legs 130, the N-type thermoelectric legs 140, and the upper electrodes 150 may be sealed from external moisture, heat, contamination, or the like. In this case, the sealing member 190 may include a sealing case 192 disposed a predetermined distance apart from surfaces of outermost sides of the plurality of lower electrodes 120, outermost sides of the plurality of P-type thermoelectric legs 130 and the plurality of N-type thermoelectric legs 140, and outermost surfaces of the plurality of upper electrodes 150, a sealing member 194 disposed between the sealing case 192 and the lower substrate 110, and a sealing member 196 disposed between the sealing case 192 and the upper substrate 160. As described above, the sealing case 192 may be in contact with the lower substrate 110 and the upper substrate 160 through the sealing members 194 and 196. Accordingly, a problem that heat conduction occurs through the sealing case 192 and thus a difference between temperatures of the lower substrate 110 and the upper substrate 160 decreases when the sealing case 192 is in direct contact with the lower substrate 110 and the upper substrate 160 can be prevented. In this case, each of the sealing members 194 and 196 may include at least one of epoxy resin and silicone resin or tape of which both surfaces are coated with at least one of epoxy resin and silicone resin. The sealing members 194 and 194 may serve to airtightly seal a gap between the sealing case 192 and the lower substrate 110 and a gap between the sealing case 192 and the upper substrate 160, can improve a sealing effect of the lower electrodes 120, the P-type thermoelectric legs 130, the N-type thermoelectric legs 140, and the upper electrodes 150, and may be interchangeably used with a finishing material, a finishing layer, a waterproofing member, a waterproofing layer, or the like. In this case, the sealing member 194, which seals the gap between the sealing case 192 and the lower substrate 110, may be disposed on an upper surface of the lower substrate 110, and the sealing member 196, which seals the gap between the sealing case 192 and the upper substrate 160, may be disposed on a side surface of the upper substrate 160. To this end, an area of the lower substrate 110 may be greater than that of the upper substrate 160. Meanwhile, guide grooves G for withdrawing lead wires 180 and 182 connected to the electrodes may be formed in the sealing case 192. To this end, the sealing case 192 may be an injection molding part formed of plastic or the like and may be interchangeably used with a sealing cover. However, the above description about the sealing member is only exemplary, and the sealing member may be changed in any of various forms. Although not illustrated in the drawings, a thermal insulation material may be further included to surround the sealing member. Alternatively, the sealing member may further include an insulating component.

As described above, although terms such as "lower substrate 110," "lower electrode 120," "upper electrode 150," and "upper substrate 160" have been used, the terms "upper" and "lower" are arbitrarily used only for the sake of ease of understanding and convenience of description, and positions thereof may also be reversed so that the lower substrate 110 and the lower electrode 120 are disposed in upper portions, and the upper electrode 150 and the upper substrate 160 are disposed in lower portions.

FIG. 5 is a perspective view illustrating a thermoelectric module according to one embodiment of the present invention, FIG. 6 is a perspective view illustrating a heat exchange unit included in the thermoelectric module according to one embodiment of the present invention, FIG. 7 is an exploded perspective view illustrating the heat exchange unit included in the thermoelectric module according to one embodiment of the present invention, FIG. 8 is a perspective view illustrating a cover included in the heat exchange unit of FIG. 7, FIG. 9 is a cross-sectional view illustrating the heat exchange unit included in the thermoelectric module according to one embodiment of the present invention, FIG. 10 is a set of views illustrating a guides disposed in a case of the heat exchange unit according to each embodiment of the present invention, and FIG. 11 is a cross-sectional view illustrating the thermoelectric module according to one embodiment of the present invention.

Referring to FIG. 5, the thermoelectric module according to one embodiment of the present invention includes a heat exchange unit 200 and a thermoelectric device 100 disposed on the heat exchange unit 200. The thermoelectric device 100 may be the thermoelectric device of the FIGS. 1 to 4.

When the thermoelectric module according to the embodiment of the present invention is a power generation apparatus which generates electricity using a difference between temperatures of a low-temperature part and a high-temperature part of the thermoelectric device 100, the heat exchange unit 200 may be in contact with the low-temperature part of the thermoelectric device 100 and serve to lower a temperature of the low-temperature part. To this end, cooling water for lowering a temperature of the low-temperature part of the thermoelectric device 100 may flow through the heat exchange unit 200. Alternatively, when the thermoelectric module according to the embodiment of the present invention is a power generation apparatus which generates electricity using a difference between temperatures of the low-temperature part and the high-temperature part of the thermoelectric device 100, the heat exchange unit 200 may also be in contact with the high-temperature part of the thermoelectric device 100 and serve to raise a temperature of the high-temperature part. To this end, hot water for raising a temperature of the high-temperature part of the thermoelectric device 100 may flow through the heat exchange unit 200.

When the thermoelectric device 100 included in the thermoelectric module according to the embodiment of the present invention is a Peltier device, the heat exchange unit 200 may be in contact with and cooled by a heat absorption surface of the thermoelectric device 100, or the thermoelectric device 100 may be in contact with and heated by a heat radiation surface.

Accordingly, the performance of the thermoelectric module according to the embodiment of the present invention may vary depending on a heat transfer efficiency between the heat exchange unit 200 and the thermoelectric device 100.

Referring to FIGS. 6 to 9, the heat exchange unit 200 includes a case 210 for accommodating a heat exchange material and a cover 220 which covers the case 210.

In this case, the heat exchange material may be a cooling fluid or heating fluid. As an example, when the thermoelectric module is a power generation apparatus, the heat exchange unit 200 may be disposed at a side of the low-temperature part of the thermoelectric device 100, and thus, the heat exchange material may be the cooling fluid. The cooling fluid may be introduced through a fluid inlet I of the case 210, accommodated in the case 210, and discharged through a fluid outlet O of the case 210. In this case, a temperature of the fluid introduced through the fluid inlet I may be lower than a temperature of the fluid discharged through the fluid outlet O. As another example, when the thermoelectric module is a power generation apparatus, the heat exchange unit 200 may be disposed at a side of the high-temperature part of the thermoelectric device 100, and thus, the heat exchange material may be a high-temperature fluid. The fluid may be introduced through the fluid inlet I of the case 210, accommodated in the case 210, and discharged through the fluid outlet O of the case 210. In this case, a temperature of the fluid introduced through the fluid inlet I may be higher than a temperature of the fluid discharged through the fluid outlet O.

As still another example, when the thermoelectric device 100 is a Peltier device, the heat exchange unit 200 may be disposed on the heat absorption surface of the thermoelectric device 100, and thus, the heat exchange material may be cooled. When the heat exchange material is a fluid, the fluid may be introduced through the fluid inlet I of the case 210, accommodated in the case 210, and discharged through the fluid outlet O of the case 210. In this case, a temperature of the fluid introduced through the fluid inlet I may be higher than a temperature of the fluid discharged through the fluid outlet O. As still another example, when the thermoelectric device 100 is a Peltier device, the heat exchange unit 200 may be disposed on the heat radiation surface of the thermoelectric device 100, and thus, the heat exchange material may be heated. When the heat exchange material is a fluid, the fluid may be introduced through the fluid inlet I of the case 210, accommodated in the case 210, and discharged through the fluid outlet O of the case 210. In this case, a temperature of the fluid introduced through the fluid inlet I may be lower than a temperature of the fluid discharged through the fluid outlet O.

In this case, the fluid is not limited to liquid and may be a material with fluidity.

According to the embodiment of the present invention, the thermoelectric device 100 may be disposed on the cover 220 of the heat exchange unit 200, and a thermal conductivity of the cover 220 may be higher than a thermal conductivity of the case 210. As an example, the cover 220 may include a metal, and the metal may be copper, aluminum, a copper-aluminum alloy, or the like. In addition, the case 210 may include an insulation material, and the insulation material may include polycarbonate (PC), acrylonitrile-butadiene-styrene (ABS), poly phenylene sulfide (PPS), or the like.

As described above, when the cover 220 on which the thermoelectric device 100 is disposed includes the metal with high thermal conductivity, and the case 210 which accommodates the heat exchange material includes the insulation material with low thermal conductivity, since the cover 220 may be an efficient heat transfer medium between the heat exchange material accommodated in the case 210 and the thermoelectric device 100, and the case 210 which accommodates the heat exchange material may insulate the heat exchange material from the outside, a heat loss of the heat exchange material can be prevented, and the heat transfer performance between the thermoelectric device 100 and the heat exchange unit 200 can be improved.

Particularly, when the heat exchange material is a fluid, the fluid inlet I and the fluid outlet O may be formed in the case 210. In this case, when the fluid inlet I and the fluid outlet O include an insulation material with low thermal conductivity like the case 210, a heat loss of the heat exchange material can be prevented while the fluid is introduced or discharged.

In addition, like the embodiment of the present invention, when only the cover 220 of the heat exchange unit 200 includes the metal, and the case 210 of the heat exchange unit 200 is formed of a plastic material such as PC, ABS, or PPS, a material cost and a weight of the heat exchange unit 200 can be reduced.

In this case, referring to FIGS. 8 and 9, the cover 220 may include a first surface 222 which is disposed toward the outside of the case 210 and on which the thermoelectric device 100 is disposed and a second surface 224 disposed toward the inside of the case 210. In addition, a plurality of heat radiation fins 230 may be formed on the second surface 224 of the cover 220. The plurality of heat radiation fins 230 may be formed of the same material as the cover 220 and integrally formed with the cover 220.

As described above, when the plurality of heat radiation fins 230 are formed on the second surface 224 of the cover 220, since a contact area between the plurality of heat radiation fins 230 and the heat exchange material in the case 210 increases, a heat transfer efficiency between the heat exchange unit 200 and the thermoelectric device 100 can further increase.

Meanwhile, the case 210 of the heat exchange unit 200 according to one embodiment of the present invention may include a first region 212 in which the plurality of heat radiation fins 230 are disposed and a second region 214 surrounding the first region 212. The heat exchange material may be accommodated in the first region 212. In this case, the plurality of heat radiation fins 230 may be spaced apart from each other, and a bottom surface 212-1 of the first region 212 and the plurality of heat radiation fins 230 may also be spaced a predetermined distance from each other. Accordingly, the heat exchange material may flow between the plurality of heat radiation fins 230 and between the bottom surface 212-1 of the first region 212 and the plurality of heat radiation fins 230.

In this case, a height H2 of the second region 214 may be greater than a height H1 of the first region 212. In addition, the second surface 224 of the cover 220 may be in contact with the second region 214 of the case 210. In addition, the case 210 and the cover 220 may be coupled by a plurality of coupling members 240 in the second region 214 of the case 210. To this end, as illustrated in FIG. 7, a plurality of holes h1 and h2 are formed in the cover 220 and the second region 214 of the case 210, and the plurality of coupling members 240 may pass through the plurality of holes h1 and h2 to couple the case 210 and the cover 220. Accordingly, the cover 220 of the heat exchange unit 200 can be stably fixed to the case 210. In this case, a predetermined distance d between the bottom surface 212-1 of the first region 212 and the plurality of heat radiation fins 230 may be 0.1 to 0.7 times, preferably 0.2 to 0.6 times, more preferably 0.3 to 0.5 times a difference between the height H2 of the second region 214 and the height H1 of the first region 212. Accordingly, the contact area between the plurality of heat radiation fins 230 and the heat exchange material is sufficiently secured, and the plurality of heat radiation fins 230 may not interfere with a flow of the heat exchange material.

Meanwhile, the case 210 of the heat exchange unit 200 according to one embodiment of the present invention may further include a third region 216 surrounding the second region 214. As described above, when the case 210 further includes the third region 216 extending outward further than the second region 214, the heat exchange material accommodated in the first region 212 may be thermally insulated from the outside. In this case, a width w3 of the third region 216 may be 0.5 to 2 times a width w2 of the second region 214. Accordingly, the thermal insulation performance of the heat exchange material accommodated in the first region 212 can be further improved.

In this case, a height H3 of the third region 216 may be greater than the height H2 of the second region 214. As an example, a difference between the height H3 of the third region 216 and the height H2 of the second region 214 may be greater than or equal to a thickness D of the cover 220. Preferably, the difference between the height H3 of the third region 216 and the height H2 of the second region 214 may be 1 to 1.2 times the thickness D of the cover 220.

Accordingly, since the third region 216 of the case 210 including the insulation material is disposed on a side surface of the cover 220, a problem of a heat loss of the heat exchange material through the side surface of the cover 220 can be prevented, and thus, a heat transfer efficiency between the cover 220 and the thermoelectric device 100 can be further improved.

Meanwhile, according to one embodiment of the present invention, the case 210 and the cover 220 of the heat exchange unit 200 may be water-tightly coupled in the second region 214. In this case, the case 210 and the cover 220 of the heat exchange unit 200 may be water-tightly coupled due to an O-ring.

To this end, a groove 214-1 having a ring shape may be formed in the second region 214 of the case 210, and an O-ring 250 may be disposed in the groove 214-1. Accordingly, a problem that the heat exchange material accommodated in the heat exchange unit 200 leaks to the outside of the heat exchange unit 200 can be prevented.

Meanwhile, according to one embodiment of the present invention, at least one guide 260 protruding from the bottom surface 212-1 of the case 210 may be disposed in the first region 212. The guide 260 may guide a flow of a fluid which is the heat exchange material. To this end, one end of the guide 260 may be spaced apart from a wall surface of the case 210. Accordingly, the fluid may pass through a space between the one end of the guide 260 and the wall surface of the case 210.

When the fluid inlet I and the fluid outlet O are formed in one surface of the case 210, the guide 260 may extend between the fluid inlet I and the fluid outlet O from a surface S1 in which the fluid inlet I and the fluid outlet O are formed toward a surface S2 opposite to the surface S1. Accordingly, the fluid introduced through the fluid inlet I may circulate in the first region 212 of the case 210 and may be discharged through the fluid outlet O. In this case, the plurality of heat radiation fins 230 may be disposed to extend in a direction parallel to a direction in which the guide 260 extends. Accordingly, the plurality of heat radiation fins 230 may not interfere with a flow of the fluid.

According to another embodiment of the present invention, a plurality of guides 260 may be disposed and may also be disposed in various shapes to form a flow path in a first region 212.

In FIG. 10, the guide disposed in a case of a heat exchange unit according to each embodiment of the present invention is illustrated. As in FIG. 10A, the guide 260 may extend between the fluid inlet I and the fluid outlet O from the surface S1 in which the fluid inlet I and the fluid outlet O are formed toward the surface S2 opposite to the surface S1 and may be spaced apart from the surface S2. Alternatively, as in FIG. 10B, the plurality of guides may be provided. That is, some guides 262 and 264 of the plurality of guides may extend between a fluid inlet I and a fluid outlet O from a surface S1 on which the fluid inlet I and the fluid outlet O are formed toward a surface S2 opposite to the surface S1 and may be spaced apart from the surface S2, and another guide 266 may extend from the surface S2 toward the surface S1 and may be spaced apart from the surface S1.

Accordingly, a fluid introduced into a heat exchange unit 200 may uniformly circulate in the heat exchange unit 200 and may be discharged from the heat exchange unit 200.

Referring to FIG. 11, the thermoelectric device 100 may be disposed on the heat exchange unit 200 according to the embodiment of the present invention. In this case, a width of a substrate 110 of the thermoelectric device 100 may be less than a width of the cover 220 of the heat exchange unit 200. As an example, the thermoelectric device 100 may be disposed in a region in which the plurality of coupling members 240 are disposed. Accordingly, since a separation space between the thermoelectric device 100 and the heat exchange unit 200 may be minimized, the heat transfer performance between the thermoelectric device 100 and the heat exchange unit 200 can be improved.

Meanwhile, a heat sink 300 may be further disposed on the thermoelectric device 100. That is, the heat exchange unit 200 may be disposed at one side of the thermoelectric device 100, the heat sink 300 may be disposed at the other side, and thus, a difference between temperatures of the high-temperature part and the low-temperature part of the thermoelectric device 100 can increase.

While the present invention has been described with reference to exemplary embodiments thereof, it will be understood by those skilled in the art that the present invention may be various changed and modified without departing from the spirit and scope of the invention defined by the appended claims below.

The invention claimed is:
1. A thermoelectric module comprising:
a heat exchange unit; and
a thermoelectric device disposed on the heat exchange unit,
wherein the heat exchange unit includes a case for accommodating a heat exchange material and a cover for covering the case,
wherein the thermoelectric device includes a lower substrate, lower electrodes, P-type thermoelectric legs, N-type thermoelectric legs, upper electrodes, an upper substrate and a sealing member,
wherein the sealing member is disposed on side surfaces of the lower electrodes, the P-type thermoelectric legs, the N-type thermoelectric legs, and the upper electrodes between the lower substrate and the upper substrate,
wherein an area of the lower substrate is 1.2 to 5 times an area of the upper substrate, wherein the thermoelectric device is disposed on the cover, and wherein a thermal conductivity of the cover is higher than a thermal conductivity of the case.

2. The thermoelectric module of claim 1, wherein the cover includes:
   a first surface which is disposed toward an outside of the case and on which the thermoelectric device is disposed; and
   a second surface disposed toward an inside of the case, and
   wherein a plurality of heat radiation fins are formed on the second surface.

3. The thermoelectric module of claim 2, wherein the case includes:
   a first region in which the plurality of heat radiation fins are accommodated; and
   a second region which surrounds the first region and includes a coupling part for coupling the case to the cover.

4. The thermoelectric module of claim 3, wherein the coupling part includes a plurality of holes, and
   wherein the case and the cover are coupled by a plurality of coupling members disposed in the plurality of holes in the second region.

5. The thermoelectric module of claim 3, wherein the coupling part includes a groove having a ring shape, and
   wherein an O-ring is disposed in the groove.

6. The thermoelectric module of claim 3, wherein the case further includes a third region which surrounds the second region and of which a height is greater than a height of the second region.

7. The thermoelectric module of claim 3, wherein a bottom surface of the first region and the plurality of heat radiation fins are spaced a predetermined distance from each other.

8. The thermoelectric module of claim 3, wherein at least one guide protruding from a bottom surface is disposed in the first region, and
   wherein one end of the guide is spaced apart from a wall surface of the case.

9. The thermoelectric module of claim 3, wherein a fluid inlet and a fluid outlet are formed in the case.

10. The thermoelectric module of claim 1, wherein the cover includes a metal, and
    wherein the case includes an insulation material.

11. The thermoelectric module of claim 7, wherein a height of the second region is higher than a height of the bottom surface of the first region, and
    wherein the predetermined distance between the bottom surface of the first region and the plurality of heat radiation fins is 0.1 to 0.7 times a difference between the height of the second region and the height of the bottom surface of the first region.

12. The thermoelectric module of claim 8, wherein an extension direction of the plurality of heat radiation fins is parallel to an extension direction of the at least one guide.

13. The thermoelectric module of claim 1, wherein a width of the thermoelectric device is less than a width of the cover.

14. The thermoelectric module of claim 1, wherein the cover includes a first surface which is disposed toward an outside of the case and on which the thermoelectric device is disposed; and a second surface disposed toward an inside of the case,
    wherein the case includes a first region accommodating the heat exchange material, and
    wherein a second region which surrounds the first region and includes a coupling part for coupling the case to the cover.

15. The thermoelectric module of claim 14, wherein a height of the second region is higher than a height of the bottom surface of the first region, and the second surface of the cover is in contact with the second region.

16. The thermoelectric module of claim 15, wherein the case further includes a third region which surrounds the second region and of which a height is greater than a height of the second region, and the third region is disposed on a side surface of the cover.

17. The thermoelectric module of claim 16, wherein a width of the third region is 0.5 to 2 times a width of the second region.

18. The thermoelectric module of claim 14, wherein a fluid inlet and a fluid outlet are formed on a first surface of the case,
    wherein a guide protruding from a bottom surface is disposed in the first region,
    wherein the guide extends from the first surface of the case toward a second surface of the case opposite to the first surface of the case, and
    wherein the guide is spaced apart from the second surface of the case.

19. The thermoelectric module of claim 14, wherein a fluid inlet and a fluid outlet are formed on a first surface of the case,
    wherein a plurality of guides protruding from a bottom surface are disposed in the first region,
    wherein a portion of the plurality of guides extends from the first surface of the case toward a second surface of the case opposite to the first surface of the case, and is spaced apart from the second surface of the case, and
    wherein another portion of the plurality of guides extends from the second surface of the case toward the first surface of the case, and is spaced apart from the first surface of the case.

20. The thermoelectric module of claim 14, wherein the case and the cover are water-tightly coupled in the second region.

* * * * *